(12) United States Patent
Jander

(10) Patent No.: US 12,040,588 B2
(45) Date of Patent: Jul. 16, 2024

(54) SEMICONDUCTOR LASER AND METHOD FOR PRODUCING A SEMICONDUCTOR LASER

(71) Applicant: OSRAM Opto Semiconductors GmbH, Regensburg (DE)

(72) Inventor: Peter Jander, Regensburg (DE)

(73) Assignee: OSRAM OPTO SEMICONDUCTORS GMBH, Regensburg (DE)

(*) Notice: Subject to any disclaimer, the term of this patent is extended or adjusted under 35 U.S.C. 154(b) by 643 days.

(21) Appl. No.: 17/295,297

(22) PCT Filed: Nov. 11, 2019

(86) PCT No.: PCT/EP2019/080864
§ 371 (c)(1),
(2) Date: May 19, 2021

(87) PCT Pub. No.: WO2020/104233
PCT Pub. Date: May 28, 2020

(65) Prior Publication Data
US 2022/0013979 A1    Jan. 13, 2022

(30) Foreign Application Priority Data
Nov. 21, 2018 (DE) ...................... 10 2018 129 346.1

(51) Int. Cl.
*H01S 5/02257* (2021.01)
*H01S 5/00* (2006.01)
(Continued)

(52) U.S. Cl.
CPC ........ *H01S 5/02216* (2013.01); *H01S 5/0064* (2013.01); *H01S 5/02255* (2021.01); *H01S 5/02257* (2021.01); *H01S 5/4093* (2013.01)

(58) Field of Classification Search
CPC ............... H01S 5/4093; H01S 5/02255; H01S 5/02257
See application file for complete search history.

(56) References Cited

U.S. PATENT DOCUMENTS

| 7,751,458 B2 | 7/2010 | Regaard et al. |
| 2002/0105627 A1 | 8/2002 | Matsuyama |

(Continued)

FOREIGN PATENT DOCUMENTS

| CN | 1933266 A | 3/2007 |
| CN | 1987528 A | 6/2007 |

(Continued)

OTHER PUBLICATIONS

Refractive index of Glass, pp. 1-7 (Year: 2024).*

(Continued)

*Primary Examiner* — Xinning(Tom) Niu
*Assistant Examiner* — Delma R Forde
(74) *Attorney, Agent, or Firm* — MH2 TECHNOLOGY LAW GROUP LLP

(57) ABSTRACT

In one embodiment, the semiconductor laser comprises a housing in which multiple laser diode chips are encapsulated. The housing comprises a cover panel and/or a lateral wall which is permeable to the generated laser radiation. The cover panel and/or the lateral wall has a light outlet surface with adjacent outlet regions. Each of the outlet regions is paired with precisely one of the laser diode chips. The light outlet surface is arranged downstream of a light outlet plane. The cover panel and/or the lateral wall has a different average thickness in the outlet regions such that the optical wavelength for the laser radiation of all of the laser diode chips is the same up to the light outlet plane with a tolerance of maximally 1.5 μm.

17 Claims, 8 Drawing Sheets

(51) Int. Cl.
*H01S 5/02216* (2021.01)
*H01S 5/02255* (2021.01)
*H01S 5/40* (2006.01)

(56) References Cited

U.S. PATENT DOCUMENTS

| | | | |
|---|---|---|---|
| 2007/0146896 A1 | 6/2007 | Chiu | |
| 2009/0245716 A1 | 10/2009 | Kojima et al. | |
| 2011/0280266 A1 | 11/2011 | Hayashi et al. | |
| 2011/0317429 A1 | 12/2011 | Aiba et al. | |
| 2012/0134008 A1 | 5/2012 | Bita et al. | |
| 2013/0021581 A1 | 1/2013 | Takahashi et al. | |
| 2013/0265770 A1 | 10/2013 | Breidenassel et al. | |
| 2015/0034975 A1* | 2/2015 | Rudmann | H01L 31/0203 257/82 |
| 2018/0031850 A1 | 2/2018 | Jiang et al. | |
| 2018/0321430 A1 | 11/2018 | Li et al. | |
| 2019/0252852 A1* | 8/2019 | Halbritter | H01S 5/0232 |
| 2021/0088200 A1 | 3/2021 | Smith et al. | |
| 2021/0254797 A1 | 8/2021 | Minor et al. | |
| 2021/0399518 A1* | 12/2021 | Schwarz | H01S 5/02255 |

FOREIGN PATENT DOCUMENTS

| | | | | |
|---|---|---|---|---|
| CN | 101625270 A | 1/2010 | | |
| CN | 102362368 A | 2/2012 | | |
| CN | 102696157 A | 9/2012 | | |
| CN | 103339548 A | 10/2013 | | |
| CN | 103368064 A | 10/2013 | | |
| CN | 104953466 A | 9/2015 | | |
| CN | 105371754 A | 3/2016 | | |
| CN | 105723530 A | 6/2016 | | |
| CN | 106019789 A | 10/2016 | | |
| CN | 106094322 A | 11/2016 | | |
| CN | 106662753 A | 5/2017 | | |
| CN | 108490724 A | 9/2018 | | |
| DE | 102010012604 A1 | 9/2011 | | |
| DE | 102013209919 A1 | 12/2014 | | |
| DE | 102014106159 A1 * | 11/2015 | | H01S 5/02204 |
| DE | 102015105807 A1 | 10/2016 | | |
| DE | 102016116439 A1 | 3/2018 | | |
| DE | 102018129343 A1 | 5/2020 | | |
| EP | 2600473 A1 | 6/2013 | | |
| JP | 2008192780 A | 8/2008 | | |
| JP | 2014072470 A | 4/2014 | | |
| JP | 201728331 A | 2/2017 | | |
| TW | 527641 B | 4/2003 | | |
| WO | 2005015701 A1 | 2/2005 | | |

OTHER PUBLICATIONS

Chinese Office Action issued in corresponding Chinese Patent Application No. 2019800767029, dated Jan. 21, 2024, with English language translation, 19 pages.

International Search Report (with English translation) and written opinion mailed Feb. 4, 2020 for corresponding International Application No. PCT/EP2019/080864 (Examiner, Unknown), 11 pages.

* cited by examiner

FIG 6

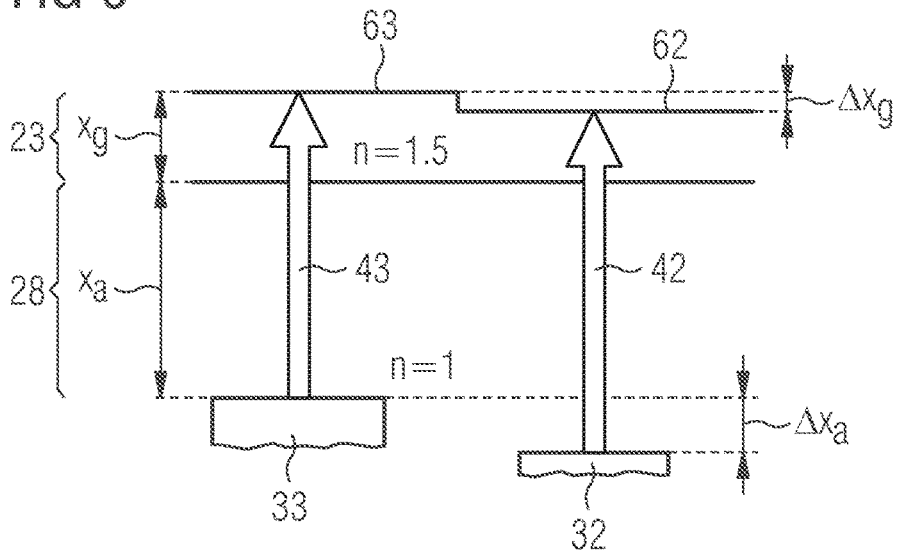

FIG 7

$$p_1 = x_a + n \cdot x_g$$
$$p_2 = x_a + \Delta x_a + n \cdot (x_g - \Delta x_g) + \Delta x_g$$
$$= x_a + \Delta x_a + n \cdot x_g - (n-1) \cdot \Delta x_g$$

$$\Delta p = p_2 - p_1$$
$$= \Delta x_a - (n-1) \cdot \Delta x_g$$

$\Delta p = 0$:
$$\Delta x_g = \Delta x_a / (n-1)$$

FIG 8

$$p_1 = n \cdot x_g$$
$$p_2 = n \cdot (x_g - \Delta x_g) + \Delta x_g$$
$$= n \cdot x_g - (n-1) \cdot \Delta x_g$$

$$\Delta p = p_2 - p_1$$
$$= -(n-1) \cdot \Delta x_g$$

$$\Delta x_g = -\Delta p / (n-1)$$

FIG 11

S1: $n_1 \sin(\alpha) = n_2 \sin(\beta)$

S2: $n_1 \sin(\gamma) = n_2 \sin(\gamma-\beta)$
$= n_2 \sin(\gamma)\cos(\beta) - n_2 \cos(\gamma)\sin(\beta)$
$= n_2 \sin(\gamma)\cos(\beta) - n_1 \sin(\alpha)\cos(\gamma)$
$= n_2 \sin(\gamma)(1 - \sin^2(\beta))^{1/2} - n_1 \sin(\alpha)\cos(\gamma)$
$= n_2 \sin(\gamma)(n_2^2 - n_2^2 \sin^2(\beta))^{1/2} - n_1 \sin(\alpha)\cos(\gamma)$
$= n_2 \sin(\gamma)(n_2^2 - n_1^2 \sin^2(\alpha))^{1/2} - n_1 \sin(\alpha)\cos(\gamma)$ $c = n_2 / n_1$:

$\sin(\gamma) = c \sin(\gamma)(c^2 - \sin^2(\alpha))^{1/2} - \sin(\alpha) \cos(\gamma)$
$\tan(\gamma) = c \tan(\gamma)(c^2 - \sin^2(\alpha))^{1/2} - \sin(\alpha)$
$\tan(\gamma) - c \tan(\gamma)(c^2 - \sin^2(\alpha))^{1/2} = -\sin(\alpha)$
$\tan(\gamma)(1 - c(c^2 - \sin^2(\alpha))^{1/2}) = -\sin(\alpha)$
$\tan(\gamma) = \sin(\alpha) / (c(c^2 - \sin^2(\alpha))^{1/2} - 1)$

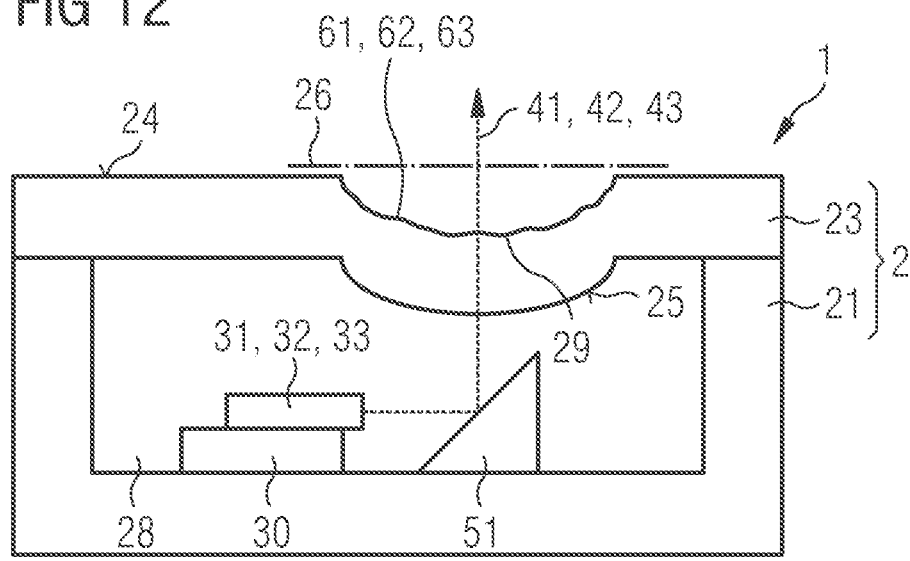

FIG 12

SEMICONDUCTOR LASER AND METHOD FOR PRODUCING A SEMICONDUCTOR LASER

CROSS-REFERENCE TO RELATED APPLICATIONS

This patent application is a national stage entry from International Application No. PCT/EP2019/080864, filed on Nov. 11, 2019, published as International Publication No. WO 2020/104233 A1 on May 28, 2020, and claims priority under 35 U.S.C. § 119 from German patent application 10 2018 129 346.1, filed Nov. 21, 2018, the entire contents of all of which are incorporated by reference herein.

FIELD

A semiconductor laser is specified. In addition, a method of manufacturing a semiconductor laser is specified.

BACKGROUND

An object to be solved is to specify a semiconductor laser which is efficiently manufacturable and which emits radiation with defined optical properties.

This object is solved inter alia by a semiconductor laser and by a method of manufacturing with the features of the independent patent claims. Preferred further developments are the subject of the dependent claims.

SUMMARY

According to at least one embodiment, the semiconductor laser comprises a housing. The housing is preferably hermetically sealed. For example, the housing comprises a semiconductor material such as silicon and/or germanium or a metallic carrier such as a molybdenum plate. Further, the housing preferably comprises at least one transparent material, such as a glass and/or sapphire. Further, the housing may include plastics. Hermetically means that there is no significant exchange of substances, such as oxygen or water vapor, between an interior and an exterior of the housing. Hermetically sealed means, for example, that a leakage rate is at most $5\times10^{-9}$ Pa m/s, in particular at room temperature.

According to at least one embodiment, the housing comprises one or more laser diode chips. The at least one laser diode chip is housed and encapsulated within the housing. In particular, the laser diode chips are located in a recess in the housing.

According to at least one embodiment, the housing comprises a cover plate. The cover plate is at least partially transmissive to the laser radiation generated during operation. The cover plate may be made of a single, homogeneous material. Alternatively, the cover plate includes areas transmissive to the laser radiation that are embedded in another material, wherein the other material need not be transmissive to the laser radiation. The cover plate is a window through which the laser radiation exits. The cover plate includes a light exit surface for the laser radiation generated during operation.

Preferably, the cover plate forms a cover of the housing, wherein the cover plate may close a recess of the housing. Preferably, the laser diode chips are attached to a bottom of the recess such that the cover plate may be arranged spaced from the laser diode chips. Thus, the cover plate is preferably distinct from a mounting platform for the laser diode chips.

According to at least one embodiment, the light exit surface comprises adjacent exit regions for the laser radiation. In plan view of the light exit surface, the exit regions preferably do not overlap. A distance between adjacent exit regions is, for example, at least 0.1 mm or 0.4 mm or 1 mm.

As an alternative to the cover plate, a side wall of the housing can serve as an exit window for the generated laser radiation. The light exit surface with the adjacent exit regions are then located in the side wall, in particular on an outer side of the side wall. Furthermore, it is possible that the light exit surface with the adjacent exit regions are distributed over one or more side walls and over the cover plate. The preceding as well as the following explanations regarding the cover plate apply equally to a side wall, if the side wall comprises at least one of the exit regions.

Furthermore, the function of the cover plate can alternatively be performed by a base plate on which the laser diode chips are mounted. In this case, the features relating to the cover plate apply correspondingly to the base plate.

According to at least one embodiment, each of the exit regions is assigned to exactly one of the laser diode chips. There is preferably a 1:1 assignment between the exit regions and the laser diode chips.

According to at least one embodiment, a light exit plane is arranged downstream of the light exit surface in a beam path. The light exit plane is preferably oriented perpendicular to radiation directions of the laser diode chips, after passing through the light exit surface. It is possible that the light exit surface lies in the light exit plane, at least in regions outside the exit regions.

According to at least one embodiment, the cover plate comprises different average thicknesses in the exit regions. That is, the cover plate is thinner in at least one exit region than in at least one further exit region. Due to the different thicknesses of the cover plate in the exit regions, an optical path length for the laser radiation of all laser diode chips up to the light exit plane is the same. The same means in particular that differences in the optical path lengths are at most 3 μm or 1.5 μm or 1 μm. Preferably, moreover, an angular tolerance of the respective laser radiation, for example to the light exit plane, is at most 2° or 1° or 0.5°.

In at least one embodiment, the semiconductor laser comprises a housing in which one or more laser diode chips are encapsulated. The housing includes a cover plate and/or a sidewall that is transmissive to laser radiation generated during operation. The cover plate and/or sidewall comprises a light exit surface with adjacent exit regions. Each of the exit regions has exactly one of the laser diode chips associated with it. A light exit plane is arranged downstream of the light exit surface in a beam path. The cover plate and/or the side wall comprise different average thicknesses in the exit regions so that an optical path length for the laser radiation of all laser diode chips up to the light exit plane is the same with a tolerance of at most 3 μm or at most 1.5 μm.

When combining multiple laser beam sources such as laser diodes with the aim of combining the radiation of the individual laser beam sources in one point, it may be advantageous to use a common optical element for focusing. A focal plane of the optical element is determined by the optical path length between the laser beam source in question and the optical element. In this case, it is necessary to set the optical path length with a high precision for all laser beam sources so that the focal point is at the same distance from the optical element for all sources. In addition, it may be necessary to adjust the direction of beam axes of the sources with high precision.

For this purpose, it is conventionally necessary to place the laser beam sources with high precision. If the laser diodes are mounted on pedestals, so-called submounts, the submounts must also be mounted with high precision in the housing. If additional optical elements are integrated into the housing, these optical elements must also be mounted with high precision. In addition, it may also be useful to precisely adjust a direction of beam axes in addition to the optical path in order to simplify mounting of the downstream optics. This applies equally to semiconductor lasers with only one laser diode chip and with multiple laser diode chips.

A high-precision passive placement of the required components without operating the laser beam sources is usually problematic, since accurate detection of laser facets is difficult. Alternatively, using a metallization of a laser diode as an orientation point is usually not possible because such metallizations are not sufficiently precisely aligned with the facets. Furthermore, placement of laser diodes or optical components with high precision is comparatively slow and thus costly. Moreover, conventional active placement, in which the laser diodes are operated, is also comparatively slow and thus expensive.

In addition, a laser diode cannot be operated at soldering temperatures, which means that an adjustment must be made close to room temperature. Subsequently, the laser diode and the submount must be brought to soldering temperature and soldered. This requires long cycle times, so that the laser diodes must be kept at soldering temperature for a long time, especially if several laser diodes are soldered onto a common submount. This often has a negative impact on a lifetime of the laser diodes.

In the semiconductor laser described here, according to the manufacturing method described here, the optical path length is adjusted by changing the path length of the transilluminated window for each beam of the laser diode chips individually after all laser diode chips are placed and fixed. For this purpose, the light cones of the individual laser diode chips should not overlap in a window and in particular at the light exit surface.

Thus, by a local change of a thickness of the window or a refractive index in the transilluminated area, the optical path can be adjusted individually for each laser diode chip. Furthermore, by locally changing the orientation of the light exit surface in the exit regions, a beam direction can be individually influenced and adjusted by light refraction.

The path length adjustment and/or the surface adjustment is possible, for example, by a local laser ablation of the window in the transilluminated exit regions. In this case, the window, i.e. the cover plate, can comprise a high refractive index in order to achieve a large influence on the optical path length with small ablation depths. Alternatively, it is possible that in the case of a window, for example made of glass, the nature of the window is locally changed by laser irradiation, so that an etchability of the material of the window is locally increased. In a further step, the window is etched, wherein a material of the window is preferably removed in the exit regions.

Thus, the thickness of the window is locally reduced and an alignment of the surface can be controlled. Furthermore, it is possible that in the case of a window, for example made of glass, the refractive index is locally changed by laser irradiation and thus the optical path is changed while the thickness remains the same.

Furthermore, it is possible that a material is applied locally to the cover plate, for example by laser sintering. In this case, the applied material preferably comprises a high refractive index in order to achieve a large difference in the optical path length with thin applied layers.

With these methods, the path length difference between the laser diode chips to the light exit plane can be adjusted and matched. For this purpose, the optical path length of all laser diode chips is measured beforehand. For the laser diode chip with the smallest or largest path length, preferably no processing of the cover plate takes place. For the other sources, the cover plate is machined to adjust the optical path length to the desired value.

It is possible to minimize the path length difference. Alternatively, the path length difference can be set to a target value, for example, to compensate in advance for chromatic aberration of a downstream optical system. In addition, it is possible to machine a material of the cover plate in all exit regions to adjust the optical path length for all laser diode chips to a predetermined target value.

Since the housing can be fully assembled and sealed before the cover plate is machined, the laser diode chips can be operated to directly measure a focal position and/or a beam direction of each laser diode chip to determine the necessary ablation or deposition of material in the exit regions. Furthermore, the focal positions and/or the beam directions can also be measured simultaneously during the processing of the cover plate, thereby directly controlling the process of machining the cover plate.

With the semiconductor laser described here, the requirements for an assembly accuracy of the laser diode chips and optical elements can be significantly reduced, which reduces an equipment cost and increases a processing speed. This is cost-effective and reduces a temperature load on the laser diode chips during soldering.

In contrast, conventional methods require multiple components to be assembled, each with high precision, since the target parameters, especially the focus position, depend on cumulative assembly errors. In the method of manufacturing described here, on the other hand, the cumulative assembly errors of all components are compensated for together after assembly. In a conventional passive placement of components, only the physical path can be controlled, wherein, however, the physical path only indirectly determines the focal position. In contrast, with the method described here, the focus position and/or beam direction, i.e., the target variables, can be measured and adjusted directly.

In conventional methods, each semiconductor laser must be precisely processed with great effort, even those that do not meet specifications due to defects or process variations. In the manufacturing method described here, the semiconductor lasers can be tested at an early stage and, if necessary, sorted out before the cover plate is processed at great expense.

According to at least one embodiment, the exit regions are or at least one of the exit regions is or most of the exit regions are planar sub-surfaces of the light exit surface. That is, the at least one exit region in question comprises no or no significant curvature for the laser radiation.

Alternatively, it is possible that at least one of the exit regions or all exit regions comprise a defined curvature. By means of such a curvature, for example, a beam profile of the laser radiation in question can be adjusted or a focusing or diverging effect can be achieved. In other words, the exit regions can be shaped similarly to a lens or a corrective optics.

According to at least one embodiment, the laser diode chips are edge-emitting semiconductor laser chips. In this case, an active zone of the laser diode chips is preferably oriented parallel or approximately parallel to the light exit plane. An emission of the laser radiation of the laser diode chips thus occurs parallel to the active zone, i.e. parallel or approximately parallel to the light exit plane. Approximately means, for example, an angular tolerance of at most 5° or 2° or 1°.

Alternatively, the laser diode chips may be surface-emitting laser chips that emit perpendicularly or approximately perpendicularly to the light exit plane. Furthermore, it is possible that edge-emitting semiconductor laser chips are mounted in the housing such that emission is perpendicular or approximately perpendicular to the light exit plane.

According to at least one embodiment, one or more deflecting optics are arranged in the housing. The at least one deflecting optic is configured to deflect the laser radiation generated during operation towards the cover plate, in particular in a direction perpendicular or approximately perpendicular to the light exit plane. For example, the deflecting optic is a 45° mirror. Preferably, the deflecting optic is reflective and planar in shape.

According to at least one embodiment, the housing comprises a base plate. Optionally, the housing further comprises a middle part, wherein such middle part is located between the base plate and the cover plate.

According to at least one embodiment, the base plate and the cover plate and the optional middle part are attached to each other by anodic bonding and/or by soldering. Alternatively or additionally, another connection technique, such as bonding or wafer bonding, may be used to connect the base plate, the cover plate and the optional middle part. This allows the laser diode chips to be hermetically encapsulated in the housing.

According to at least one embodiment, the middle part and the cover plate are made of the same material. For example, a glass is used. The middle part and the cover plate are preferably attached to each other via anodic bonding. For example, the base plate is made of a semiconductor material such as silicon. Alternatively, the base plate is a printed circuit board, for example made of a ceramic material or based on a metal, such as a metal core board.

According to at least one embodiment, the middle part comprises the deflecting optics. In this case, there is preferably exactly one deflecting optics which, as an oblique boundary surface of a recess of the middle part, directs all laser beams of the laser diode chips towards the cover plate. In this case, the laser diode chips are preferably arranged in the recess of the housing, in particular of the middle part.

According to at least one embodiment, a thickness of the cover plate at least outside the exit regions is at least 0.1 mm or 0.2 mm or 0.3 mm. Alternatively or additionally, this thickness of the cover plate is at most 2 mm or 1 mm or 0.5 mm or 0.3 mm.

According to at least one embodiment, a thickness reduction of the cover plate in at least one of the exit regions is at least 30 µm or 50 µm or 0.1 mm or 0.14 mm, or the cover plate is configured for such a thickness reduction or maximum thickness reduction. The actual thickness reduction or the possible thickness reduction may be comparatively large relative to the thickness of the cover plate. For example, the thickness reduction in at least one of the exit regions is at least 20% or 35% or 50% and/or at most 80% or 70% of the thickness of the cover plate outside the exit regions, or such thickness reduction is enabled.

Depending on the statistically varying accuracy of the placement of the laser diode chips in particular, it is possible that for some semiconductor lasers only a relatively small thickness reduction in the exit regions is necessary to obtain the desired optical path length with the required accuracy. For example, maximum thickness changes of only at least 3 µm or 20 µm are required in one of the exit regions or in all exit regions.

Previously, mainly only one thickness reduction was specified. The same values apply analogously for a thickness increase by material impact as well as for a change of the optical path length by means of a refractive index change, without a geometric thickness change.

According to at least one embodiment, a refractive index of the cover plate for the laser radiation generated in operation is at least 1.4 or 1.6. Alternatively or additionally, the refractive index is at most 2.5 or 2.0 or 1.8 or 1.6. In the case of a glass for the cover plate, the refractive index is preferably between and including 1.4 and 1.6. These values for the refractive index apply to the wavelength of the respective laser radiation and in particular at a temperature of 300 K, i.e. approximately room temperature.

According to at least one embodiment, the exit regions comprise different shapes when viewed in plan view of the light exit surface and/or in cross-section through the light exit surface. For example, when viewed in plan view, the exit regions are rectangular or elliptical or circular in shape. Viewed in cross-section, the exit regions are preferably straight line sections or also arcuate or hyperbolic curve sections.

According to at least one embodiment, at least one of the exit regions is or all exit regions or most exit regions are oriented obliquely to the light exit plane. An angle between the light exit plane and the relevant exit region is preferably relatively small and is in particular at most 5° or 3°. Alternatively or additionally, this angle is at least 0.2° or 0.5° or 1° or 1.5°.

According to at least one embodiment, the cover plate comprises a light entrance surface. The light entrance surface is opposite the light exit surface. The light entrance surface is preferably flat. It is possible that the light entrance surface comprises an optically effective coating such as an anti-reflective coating.

According to at least one embodiment, an optical distance of the laser diode chips to the light entrance surface along a beam path of the respective laser radiation is at least 0.2 mm or 0.3 mm or 0.5 mm. Alternatively or additionally, this optical distance is at most 3 mm or 2 mm or 1.5 mm. With other words, the light entrance surface is optically comparatively close to the laser diode chips. In particular, the beam path is first approximately parallel to the light entrance surface and then runs approximately perpendicular to the light entrance surface from the optional deflecting optic.

According to at least one embodiment, the semiconductor laser is designed as an RGB unit. Thus, at least one of the laser diode chips is configured to generate red light, at least one of the laser diode chips is configured to generate green light, and at least one of the laser diode chips is configured to generate blue light. These laser diode chips are preferably electrically operable independently of each other.

Furthermore, it is possible that further laser diode chips are present which emit radiation in non-visible spectral ranges, for example laser diode chips for generating near-ultraviolet radiation and/or for generating near-infrared radiation.

According to at least one embodiment, the laser diode chips are jointly followed by beam shaping optics and/or a movable deflection mirror. The beam shaping optics and/or the movable deflection mirror are preferably located outside the housing. Such beam shaping optics and/or a movable deflection mirror may be located in a further housing, in which the housing of the semiconductor laser with the laser diode chips is also located.

According to at least one embodiment, at least one of the exit regions is or are all exit regions of the cover plate are directly provided with one or more anti-reflective coatings. The at least one anti-reflective coating may extend continuously over the light exit surface or may be limited to the exit regions or to a particular exit region in each case.

According to at least one embodiment, the exit regions are arranged along a straight line as seen in plan view of the light exit plane. In particular, optical centers, i.e., penetration points of optical axes through the exit regions, lie on a straight line.

According to at least one embodiment, an average roughness of the exit regions is at most 0.3 µm or 0.2 µm or 0.1 µm or 0.05 µm or 0.02 µm. Thus, the exit regions are comparatively smooth in shape.

Furthermore, a method of manufacturing for such a semiconductor laser is specified. Features of the method of manufacturing are also disclosed for the semiconductor laser, and vice versa.

In at least one embodiment, the method comprises the following steps, preferably in the order indicated:
A) providing the housing, preferably with the laser diode chips fully encapsulated therein,
B) operating the laser diode chips and measuring a radiation characteristic from each of the laser diode chips,
C) modifying the cover plate and/or the side wall in the exit regions so that positioning tolerances of the laser diode chips in the housing are compensated and the optical path length for the laser radiation of all laser diode chips up to the light exit plane is equal with a tolerance of at most 3 µm or of at most 1.5 µm and/or is equal with a tolerance of at most 3 µm or of at most 1.5 µm to a previously predetermined target value.

As an alternative to an encapsulation of the laser diode chips already prior to operation and measurement, it is possible to operate and measure the laser diode chips in particular evacuated or in a protective atmosphere. Subsequently, the cover plate can be processed as a separate part and independently of the other components of the semiconductor laser. Only after machining is the cover plate then applied to the at least one remaining component of the housing, so that the laser diode chips are encapsulated only after the exit regions have been created. This is particularly advantageous if machining the cover plate could damage other components of the semiconductor lasers, for example optics or the laser diode chips.

According to at least one embodiment, material is removed from the cover plate in step C). Thus, the cover plate is thinner in at least one of the exit regions than adjacent to the exit regions. Alternatively, a material is applied such that the cover plate is thicker in the respective exit region than in regions adjacent to the exit regions.

According to at least one embodiment, material removal is performed by laser ablation and/or by laser-induced structural change in combination with subsequent etching.

Alternatively to material removal or material addition, a geometric thickness of the cover plate may remain the same, wherein an optical thickness is varied by changing the material of the cover plate. This means that the refractive index of the material of the cover plate is locally changed, for example by means of laser radiation.

According to at least one embodiment, smoothing of the light exit surface takes place after step C) in at least one of the exit regions. This smoothing is preferably performed by means of laser polishing. In this way, irregularities or roughnesses of the light exit surface in the exit regions can be reduced or eliminated. Such roughnesses result, for example, from laser ablation.

BRIEF DESCRIPTION OF THE DRAWINGS

In the following, a semiconductor laser described herein and a method of manufacturing described herein are explained in more detail with reference to the drawing by means of exemplary embodiments. Identical reference signs thereby specify identical elements in the individual figures.

However, no scale references are shown; rather, individual elements may be shown in exaggerated size for better understanding.

In the Figures:

Figure 1:
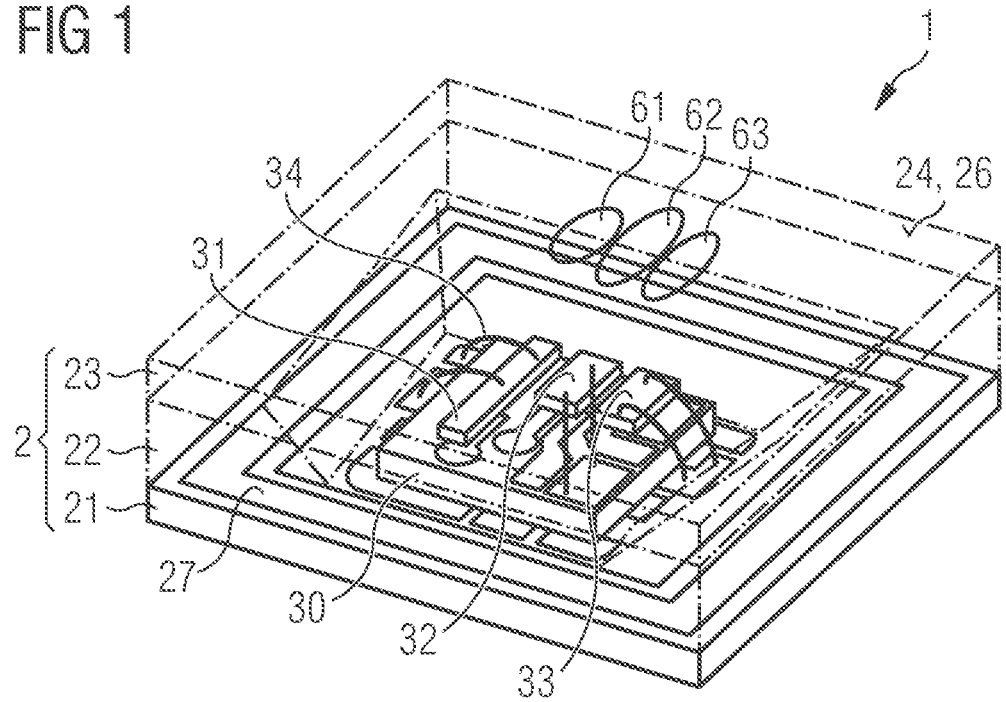
Figure 2:
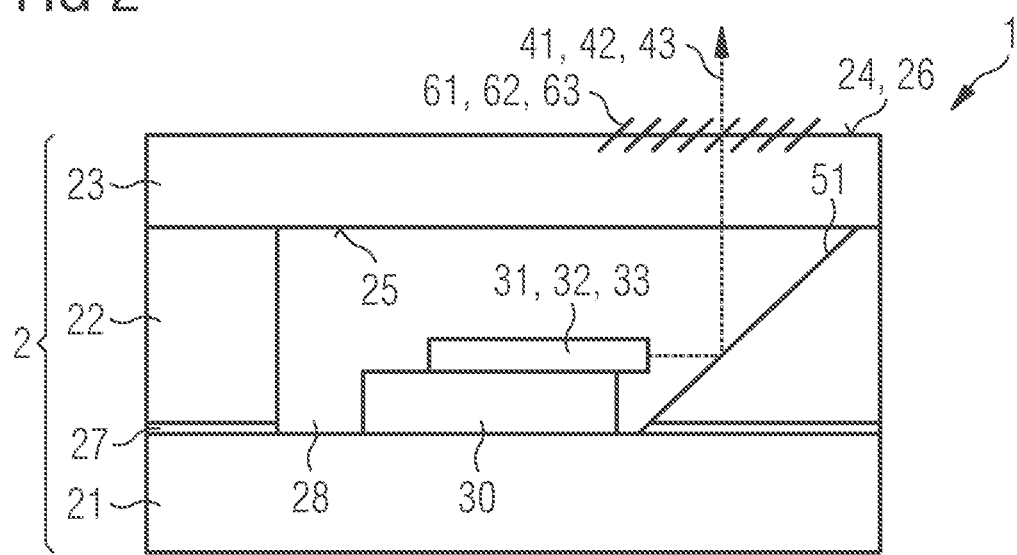
Figure 3:
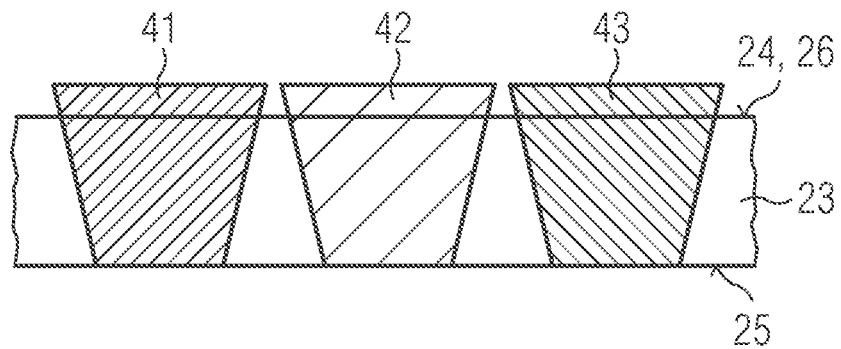
Figure 4:
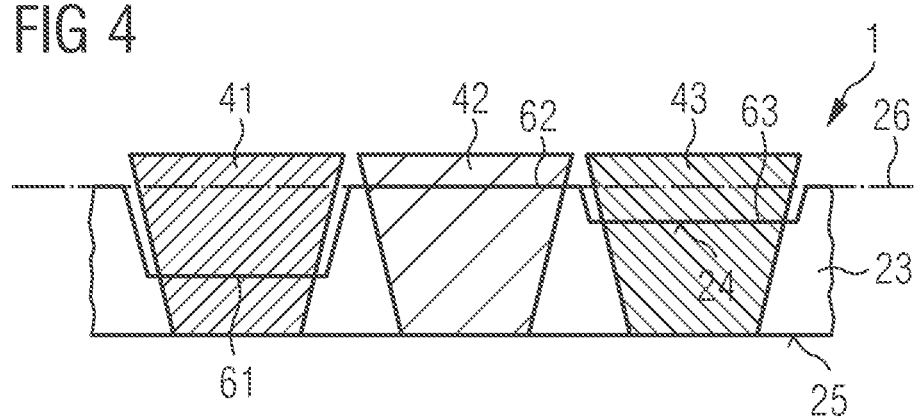
Figure 5:
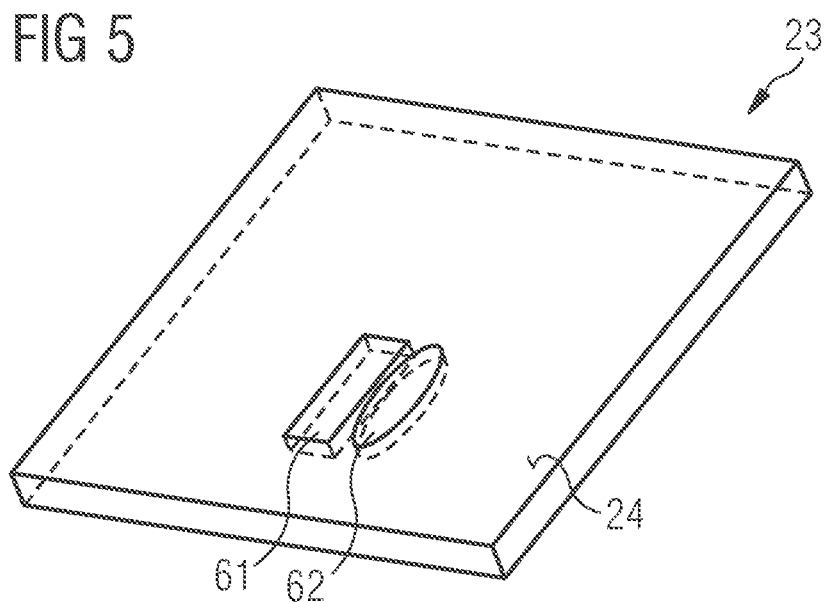
Figure 9:
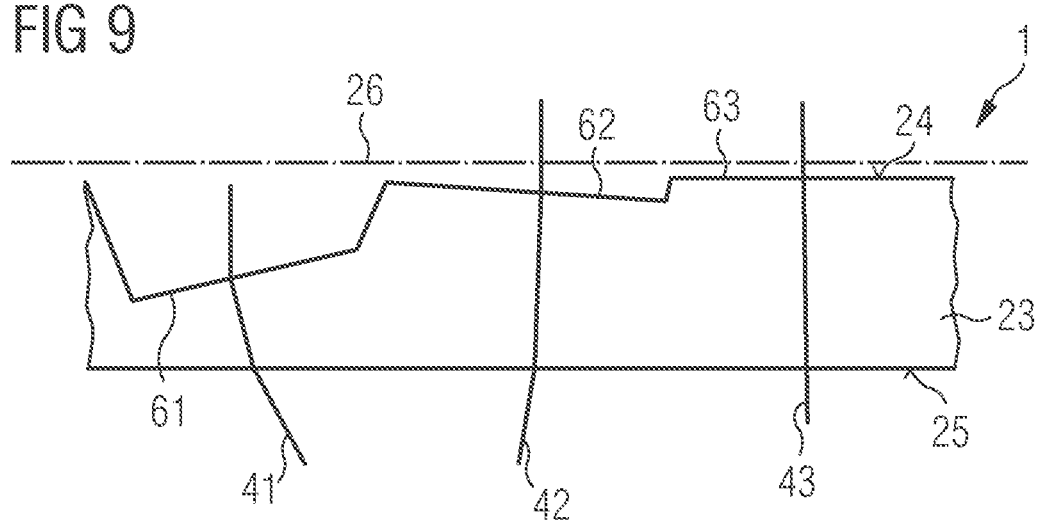
Figure 10:
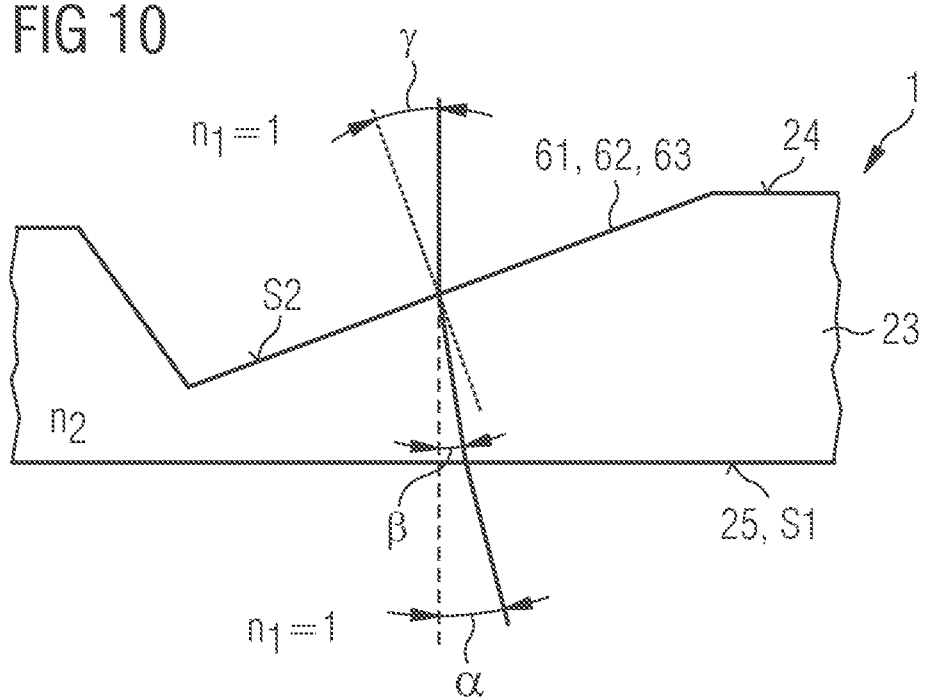
Figure 13:
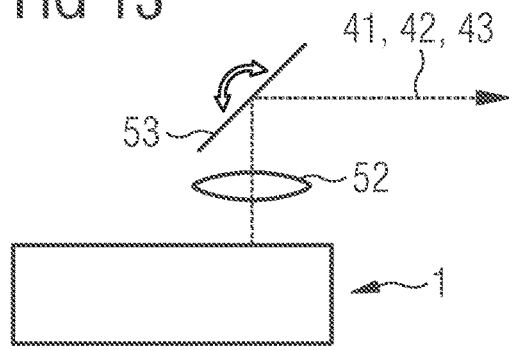
Figure 17:
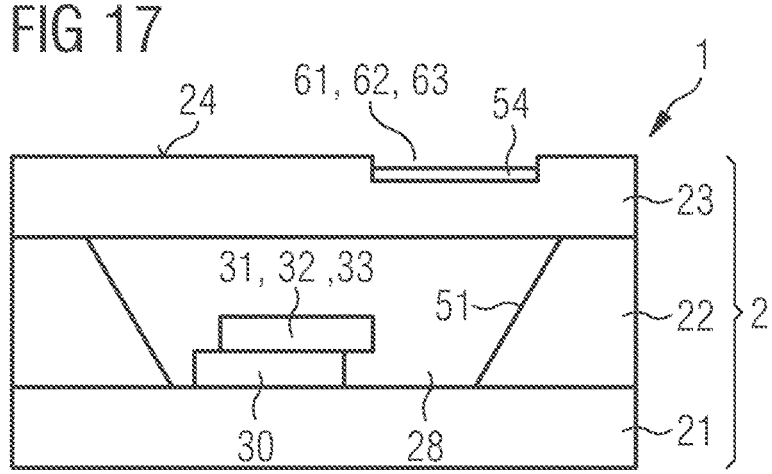
Figure 18:
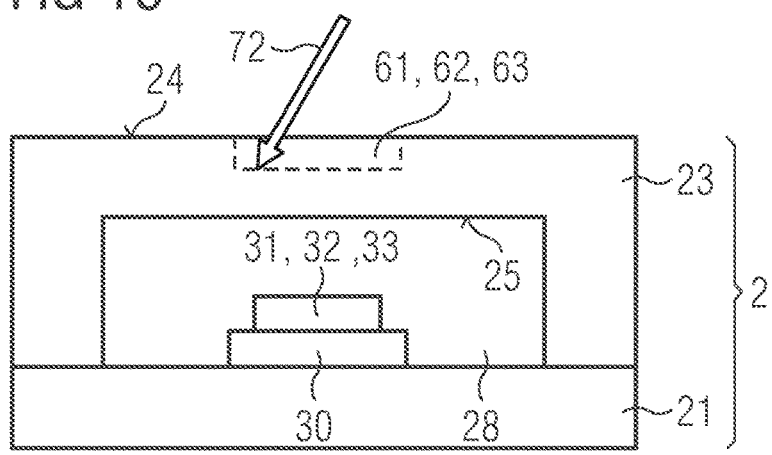
Figure 19:
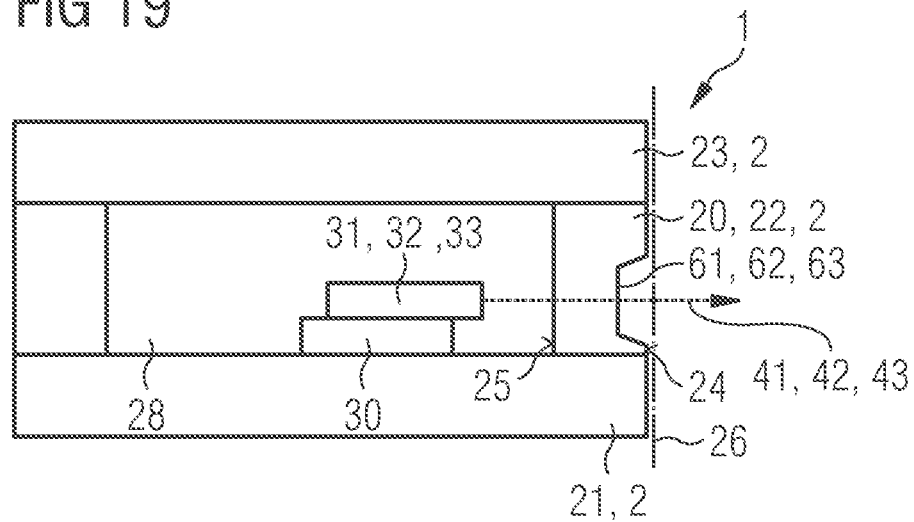

FIG. 1 shows a schematic perspective view of an exemplary embodiment of a semiconductor laser described herein, FIGS. 2 to 4 show schematic sectional views of exemplary embodiments of semiconductor lasers described herein, FIG. 5 shows a schematic perspective view of a cover plate for semiconductor lasers described herein, FIGS. 6 to 8 show calculations of a path length difference for semiconductor lasers described herein, FIG. 9 shows a schematic sectional view of an exemplary embodiment of a semiconductor laser described herein, FIGS. 10 and 11 show calculations for a tilting of exit regions for semiconductor lasers described herein, FIGS. 12 and 13 show schematic sectional views of exemplary embodiments of semiconductor lasers described herein, FIGS. 14 to 18 show schematic sectional views of steps of a manufacturing method for semiconductor lasers described herein, and FIG. 19 shows a schematic sectional view of an exemplary embodiment of a semiconductor laser described herein.

DETAILED DESCRIPTION

FIG. 1 illustrates an exemplary embodiment of a semiconductor laser 1. The semiconductor laser 1 comprises three laser diode chips 31, 32, 33, which are preferably configured to generate red, green and blue light. The laser diode chips 31, 32, 33 are optionally mounted on a submount 30. The laser diode chips 31, 32, 33 are edge-emitting laser chips. Reference numeral 34 indicates a bonding wire.

The laser diode chips 31, 32, 33 are located in a housing 2. The housing 2 is composed of a base plate 21, a middle part 22 and a cover plate 23. The base plate 21 and the middle part 22 are joined together in a hermetically sealed manner via a solder joint 27. A connection between the cover plate 23 and the middle part 22 is preferably made without a bonding agent by anodic bonding. The middle part 22 and the cover plate 23 are preferably made of a glass and are transmissive to laser radiation 41, 42, 43 generated during operation. The laser diode chips 31, 32, 33 are thus located in a recess 28 of the middle part 22.

In FIG. 2 a sectional view of the semiconductor laser 1 of FIG. 1 is shown. The laser diode chips 31, 32, 33 emit the laser radiation 41, 42, 43 in the direction parallel to a light exit plane 26. The light exit plane 26 extends largely in a light exit surface 24 of the cover plate 23. At a deflecting optics 51, the laser radiation 41, 42, 43 is deflected in the direction toward the cover plate 23. The laser radiation 41, 42, 43 enters the cover plate 23 via a flat light entrance surface 25.

In the light exit surface 24, the cover plate 23 further comprises a plurality of exit regions 61, 62, 63 for the respective laser diode chips 31, 32, 33. The exit regions 61, 62, 63 are symbolized by ellipses in FIG. 1, and by a hatched area in FIG. 2. In a top view of the light exit surface 24, the exit regions 61, 62, 63 are adjacent to each other. In the exit regions 61, 62, 63, a correction is made to an optical path length of the laser radiation 41, 42, 43.

This correction to the optical path length is illustrated in more detail in FIGS. 3 and 4. In FIG. 3, the cover plate 23 is shown in its original state, still without correction and essentially still without the exit regions 61, 62, 63. FIG. 4 illustrates that the cover plate 23 comprises different thicknesses in the exit regions 61, 62, 63. The different thicknesses and the different refractive index of the cover plate 23 compared to an environment are used to correct for the desired optical path length between the laser diode chips, which are not shown, and the light exit plane 26.

In regions of the cover plate 23 in which the cover plate 23 still comprises the original thickness, the light exit plane 26 is located in the light exit surface 24. In this respect, the light exit surface 26 can be an at least partially fictitious plane which is oriented in particular perpendicular to a main radiation direction of the laser diode chips. The exit region 62, in which the cover plate 23 has not been modified, lies in the light exit plane 26.

In FIG. 5, a finished cover plate 23 is drawn as an example, without the remaining components of the semiconductor laser 1. It can be seen that the exit regions 61, 62 can comprise different basic shapes, seen in plan view of the light exit surface 24. The same may apply to all other exemplary embodiments.

The cover plate of FIG. 5 can be manufactured separately from the other components of the housing 2. For this purpose, the laser diode chips 31, 32, 33 are operated and measured, for example, in an inert gas atmosphere. The correction data obtained from the measurement is used to machine or at least partially machine the cover plate 23.

The at least partially machined cover plate 23 is then used to close the housing 2. If necessary, a post-correction of the exit regions 61, 62, 63 can still be performed if the cover plate 23 is already attached by operating and measuring the laser diode chips 31, 32, 33 again and processing the exit regions 61, 62, 63 again.

If the cover plate 23 is exclusively processed separately from the other components of the semiconductor laser 1, the exit regions 61, 62, 63 may also be located at the light entrance surface and not necessarily at the light exit surface. The features described above for the light exit surface then apply accordingly to light entrance surface. The same applies to all other exemplary embodiments.

In the schematic of FIG. 6 and in the associated calculations of FIGS. 7 and 8, it is explained how a thickness correction is to be carried out in the exit regions 62, 63, illustrated by way of example with two laser diode chips 32, 33 with laser beams 42, 43. The laser diode chips 32, 33 are located in a gas or in an evacuated region of the recess 28 with a refractive index n of 1 or of approximately 1. In this region, the laser radiation 43 covers a distance $x_a$ in air.

The index a stands for air. The distance $x_g$ is covered in the medium of the cover plate 23, for example a glass with a refractive index n of 1.5. The index g stands in each case for glass.

From FIG. 7 it can be seen that the path length difference $\Delta x_g$ for the laser radiation 42, corresponding to the change in thickness of the cover plate 23 in the relevant exit region 62, results from the path length difference $\Delta x_a$ in the recess 28 divided by the refractive index n-1. For a refractive index of the cover plate 23 of approximately 1.5, this means that the thickness correction $\Delta x_g$ is approximately twice the optical path length difference $\Delta x_a$ in the recess 28.

FIG. 8 illustrates an estimate for the precision required in the design of the thicknesses of the cover plate 23 in the exit regions 61, 62, 63. The allowed tolerance $\Delta x_g$ for the thickness of the cover plate 23 depends on the allowed tolerance of the optical path length $\Delta p$ and the refractive index n of the cover plate. For example, for an allowed tolerance of the optical path lengths $\Delta p$ of 1.5 µm and a refractive index n of the cover plate 23 of 1.5, the tolerance for the thickness variation $\Delta x_g$ is 3 µm.

For example, if the laser diode chips 31, 32, 33 comprise a mounting tolerance of +/−10 µm, relative to the deflecting optics 51, this results in a maximum difference of the optical paths of 20 µm. To compensate for a maximum occurring tilt angle α of, for example, 4°, a path length difference of approximately 50 µm is also required. The optical path length to be corrected is thus about 70 µm. This results in a change in thickness of the cover plate 23 of at most 140 µm with a refractive index of 1.5 for the cover plate 23. If the refractive index of the cover plate 23 is 1.8, for example, the necessary change in thickness of the cover plate 23 is only about 90 µm.

The path length $x_a$ in the recess 28 is approximately 0.5 mm, for example. The thickness $x_g$ of the cover plate 23, i.e. the original thickness of the cover plate 23, is for example 200 µm. This results in a total optical path length of about 800 µm up to the light exit plane 26, which would have to be corrected by up to about 70 µm, i.e. about 10%.

FIG. 9 illustrates that the exit regions 41, 42, 43 not only comprise different thicknesses, but are also arranged obliquely to the light exit plane 26. The oblique exit regions 61, 62 can be used to correct an exit angle of the laser beams 41, 42, 43. This is shown schematically in FIG. 9 for the laser beams 41, 42, 43.

A calculation of a tilt angle γ of the exit regions 61, 62, 63 in order to achieve the necessary angular correction is illustrated in more detail in FIGS. 10 and 11. Here, S1 refers to the light entrance surface 25 and S2 refers to the exit region 61, 62, 63 in question.

For a refractive index $n_2$ of the cover plate 2 of 1.5, an entrance angle α of 3° to be corrected results in an angle γ of the relevant exit region 61, 62, 63 of 2.4°. If the angle α to be corrected is 1.5°, the correction angle γ is approximately 1.2°. A desired angular tolerance with which the emitted laser beams 41, 42, 43 corrected by the cover plate 23 are perpendicular to the light exit plane 26 is preferably at most 1°.

FIG. 12 illustrates another exemplary embodiment of the semiconductor laser 1. The recess 28 is made directly in the base plate 21. Furthermore, a separate deflecting optics 51 is provided. The light entrance surface 25 may be curved and shaped, for example, as a lens. A low roughness 29 of, for example, at most 100 nm can be present at the light exit surface 24 in the exit regions 61, 62, 63. These variants mentioned in connection with FIG. 12 may also be present individually or in any combination in all other exemplary embodiments.

In the exemplary embodiment of FIG. 13, a common beam-processing optical element 52 and a common movable deflection mirror 53 are arranged downstream of all laser diode chips 31, 32, 33 of the semiconductor laser 1. These optical elements 52, 53 are thus provided for all laser beams 41, 42, 43. The components 1, 52, 53 may be integrated in a common further housing, not drawn.

For example, the components 1, 52, 53 of FIG. 13 are an assembly in VR goggles or in AR goggles, wherein VR stands for virtual reality and AR stands for augmented reality.

FIGS. 14 to 17 illustrate an exemplary method of manufacturing for exemplary embodiments of semiconductor lasers 1. According to FIG. 14, the encapsulated laser diode chips 31, 32, 33 are provided in the housing 2 and temporarily operated. Via an optional measuring optics 82 as well as via a camera 81 an analysis of the optical path length and/or of a radiation direction and/or of a beam profile of the laser beams 41, 42, 43 is carried out. On the basis of this measurement it is calculated how the later exit regions 61, 62, 63 are to be designed.

Figure 15:
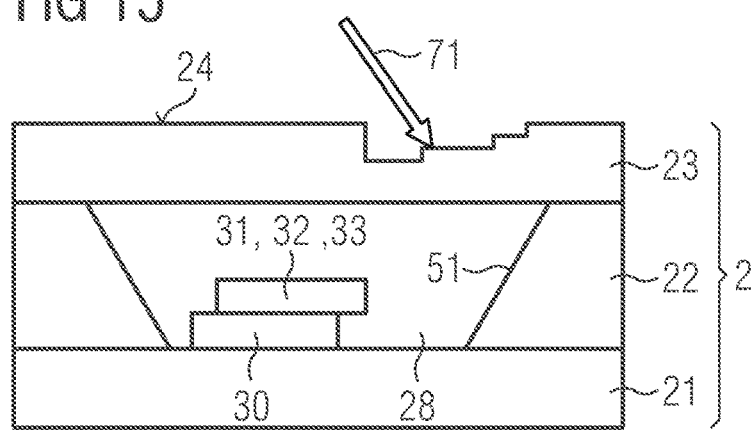

In FIG. 15 it is illustrated that ablation of material from the cover plate 23 takes place via a laser beam 71.

Figure 14:
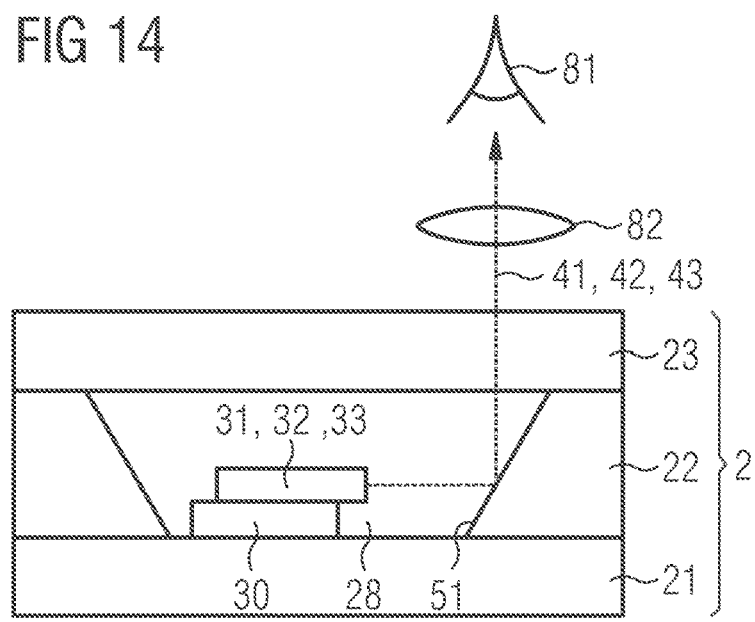

The steps of FIGS. 14 and 15 can be carried out iteratively or the step of FIG. 15 can be carried out simultaneously with the step of FIG. 14 so that the laser diodes 31, 32, 33 can be operated during the processing of the cover plate 23 and the material removal can be actively controlled.

Figure 16:
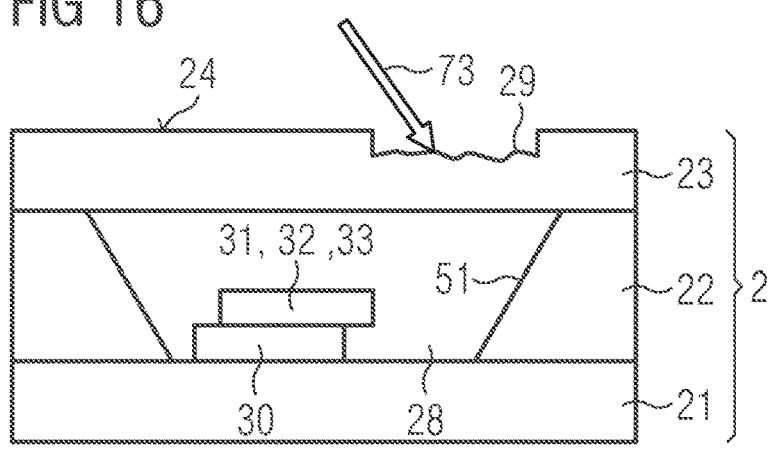

In the optional step of FIG. 16, it is shown that the surface for the exit regions, created for example by laser ablation, comprises a roughness 29. A laser beam 73, in particular infrared laser radiation, can be used for laser polishing and thus for smoothing.

Thus, see FIG. 17, a smooth exit region 61, 62, 63 results. Optionally, the exit regions 61, 62, 63 can be provided with an anti-reflective coating 54. A common anti-reflective coating may be present or individual anti-reflective coatings may be applied. The anti-reflective coating 54 may extend over the entire surface of the light exit surface 24 or may be applied only locally in the relevant exit region 61, 62, 63.

FIG. 18 illustrates an alternative method for shaping the exit regions 61, 62, 63. By means of a laser beam 72, a structural change of material within the cover plate 23 is effected, wherein a desired geometry of the exit regions 61, 62, 63 is defined. With a subsequent etching process, not shown, these material changes can be etched out, resulting in the exit regions 61, 62, 63. Such a method is also referred to as stealth dicing.

Furthermore, as a variant shown in FIG. 18, the recess 28 is present in the cover plate 23. The base plate 21 can thus have a flat design and a middle part can be omitted. Furthermore, it is possible that the laser diode chips 31, 32, 33 are surface-emitting laser diode chips or edge-emitting laser diode chips that emit approximately in the direction perpendicular to the light entrance surface 25. These variations may be present individually or in combination in all other exemplary embodiments.

Deviating from the method steps of FIGS. 15 and 18, it is alternatively possible, for example, to apply an additional material to the cover plate 23 via laser sintering so that the thickness increases locally. Furthermore, it is alternatively or also additionally possible that a change in the refractive index takes place locally within the cover plate 23, so that the geometric thickness of the cover plate 23 need not be changed.

In the preceding figures, the thickness variation for the exit regions 61, 62, 63 took place in each case in the cover plate 23 of the housing 2. In contrast, the cover plate 23 in FIG. 19 does not comprise a specific thickness variation, but a side wall 20 is provided with the exit regions 61, 62, 63.

Thus, the optical thickness of the side wall 20 varies in places to provide a correction to the optical path length and/or to the radiation direction. In this arrangement, a deflecting optics can be omitted. The side wall 20 is preferably made in one piece with the middle part 22.

The above features relating to the exit regions 61, 62, 63 in the cover plate 23 apply in the same way to exit regions 61, 62, 63 which are located in the side wall 20 as shown in FIG. 19.

The invention described herein is not limited by the description based on the exemplary embodiments. Rather, the invention encompasses any new feature as well as any combination of features, which in particular includes any combination of features in the patent claims, even if that feature or combination itself is not explicitly specified in the patent claims or exemplary embodiments.

The invention claimed is:

1. A semiconductor laser with a housing and with a plurality of laser diode chips encapsulated in the housing, wherein
    the housing comprises a cover plate and/or a side wall which is transmissive for laser radiation generated during operation,
    the cover plate and/or the side wall comprises a light exit surface with adjacent exit regions
    each of the exit regions is assigned to exactly one of the laser diode chips, and
    a light exit plane is arranged downstream of the light exit surface in a beam path, and
    the cover plate and/or the side wall comprise different average thicknesses in the exit regions, so that an optical path length for the laser radiation of all laser diode chips up to the light exit plane is the same with a tolerance of at most 3 μm.

2. The semiconductor laser according to claim 1,
    in which the exit regions are each planar partial surfaces of the light exit surface and the exit regions are all located in the cover plate,
    wherein the tolerance within which the optical path lengths are equal is at most 1.5 μm.

3. The semiconductor laser according to claim 1,
    wherein the laser diode chips are edge-emitting semiconductor laser chips,
    wherein, in operation, an emission of the laser diode chips is in a direction parallel to the light exit plane, and
    wherein at least one deflecting optic is arranged downstream of the laser diode chips in the housing, which optic is configured to deflect laser radiation generated during operation towards the cover plate.

4. The semiconductor laser according to claim 3,
    wherein the middle part is mounted between the base plate and the cover plate, and
    wherein the middle part comprises the exact one deflecting optics as a planar oblique boundary surface of a recess, and the laser diode chips are arranged in the recess of the middle part.

5. The semiconductor laser according to claim 1,
    wherein the housing further comprises a base plate and a middle part,
    wherein the base plate, the middle part and the cover plate are attached to each other by means of anodic bonding and/or soldering such that the laser diode chips are hermetically encapsulated in the housing, and
    wherein the middle part and the cover plate are of the same material.

6. The semiconductor laser according to claim 1,
wherein a thickness of the cover plate outside the exit regions is between 0.2 mm and 2 mm inclusive,
wherein a thickness reduction in at least one of the exit regions is at least 0.1 mm.

7. The semiconductor laser according to claim 1,
wherein the cover plate and/or the side wall is made of a glass,
wherein a refractive index of the cover plate and/or the side wall for the laser radiation generated in operation at a temperature of 300 K is between 1.4 and 1.6, inclusive.

8. The semiconductor laser according to claim 1,
wherein the exit regions have different shapes in plan view of the light exit surface and/or in cross-section through the light exit surface.

9. The semiconductor laser according to claim 1,
wherein at least one of the exit regions is oriented obliquely with respect to the light exit plane, wherein an angle between the light exit plane and the respective exit region is between 0.5° and 5°, inclusive.

10. The semiconductor laser according to claim 1,
wherein a light entrance surface of the cover plate and/or the side wall is planar,
wherein the light entrance surface faces the light exit surface, and a distance of the laser diode chips from the light entrance surface along a beam path is between 0.3 mm and 3 mm, inclusive.

11. The semiconductor laser according to claim 1,
wherein one of the laser diode chips is configured to generate red light, one of the laser diode chips is configured to generate green light, and one of the laser diode chips is configured to generate blue light, and the laser diode chips are electrically controllable independently of each other,
wherein the laser diode chips are jointly followed by a beam shaping optics and/or a movable deflection mirror.

12. The semiconductor laser according to claim 1,
wherein the exit regions are directly provided with at least one anti-reflective coating,
wherein the exit regions are arranged along a straight line as seen in plan view of the light exit plane, and
wherein an average roughness of the exit regions is at most 0.2 µm in each case.

13. The semiconductor laser according to claim 1,
wherein the exit regions are all located in the side wall.

14. A method of manufacturing a semiconductor laser according to claim 1 comprising the steps:
A) providing the housing, preferably with the laser diode chips fully encapsulated therein,
B) operating the laser diode chips and measuring a radiation characteristic from each of the laser diode chips,
C) modifying the cover plate and/or the side wall in the exit regions so that positioning tolerances of the laser diode chips in the housing are compensated and the optical path length for the laser radiation of all laser diode chips up to the light exit plane is equal with a tolerance of at most 3 µm and/or is equal with a tolerance of at most 3 µm to a previously predetermined target value.

15. The method of manufacturing according to claim 14,
wherein in step C) material is removed from the cover plate and/or from the side wall so that the cover plate and/or the side wall becomes thinner in at least one of the exit regions than adjacent to the exit regions.

16. The method of manufacturing according to claim 15,
wherein the material removal is performed by means of laser ablation and/or by means of laser-induced structural change within the cover plate and/or within the side wall and subsequent etching.

17. The method of manufacturing according to claim 14,
in which, after step C), at least one of the exit regions is smoothed by means of laser polishing.

* * * * *

UNITED STATES PATENT AND TRADEMARK OFFICE
CERTIFICATE OF CORRECTION

PATENT NO. : 12,040,588 B2
APPLICATION NO. : 17/295297
DATED : July 16, 2024
INVENTOR(S) : Peter Jander It is certified that error appears in the above-identified patent and that said Letters Patent is hereby corrected as shown below:

In the Claims

Replace Column 12, Line 20 - Column 14, Line 37, (approx.) with the following Claims:

1. A semiconductor laser with a housing and with a plurality of laser diode chips encapsulated in the housing, wherein
- the housing comprises a cover plate and/or a side wall which is transmissive for laser radiation generated during operation,
- the cover plate and/or the side wall comprises a light exit surface with adjacent exit regions
- each of the exit regions is assigned to exactly one of the laser diode chips, and
- a light exit plane is arranged downstream of the light exit surface in a beam path, and
- the cover plate and/or the side wall comprise different average thicknesses in the exit regions, so that an optical path length for the laser radiation of all laser diode chips up to the light exit plane is the same with a tolerance of at most 3 µm.

2. The semiconductor laser according to claim 1,
in which the exit regions are each planar partial surfaces of the light exit surface and the exit regions are all located in the cover plate, wherein the tolerance within which the optical path lengths are equal is at most 1.5 µm.

3. The semiconductor laser according to claim 1,
wherein the laser diode chips are edge-emitting semiconductor laser chips,
wherein, in operation, an emission of the laser diode chips is in a direction parallel to the light exit plane, and
wherein at least one deflecting optic is arranged downstream of the laser diode chips in the housing, which optic is configured to deflect laser radiation generated during operation towards the cover plate.

4. The semiconductor laser according to claim 1,

Signed and Sealed this
Twenty-fifth Day of March, 2025

Coke Morgan Stewart
*Acting Director of the United States Patent and Trademark Office* wherein the housing further comprises a base plate and a middle part,
wherein the base plate, the middle part and the cover plate are attached to each other by means of anodic bonding and/or soldering such that the laser diode chips are hermetically encapsulated in the housing, and wherein the middle part and the cover plate are of the same material.

5. The semiconductor laser according to claim 3,
wherein the middle part is mounted between the base plate and the cover plate, and
wherein the middle part comprises the exact one deflecting optics as a planar oblique boundary surface of a recess, and the laser diode chips are arranged in the recess of the middle part.

6. The semiconductor laser according to claim 1,
wherein a thickness of the cover plate outside the exit regions is between 0.2 mm and 2 mm inclusive, wherein a thickness reduction in at least one of the exit regions is at least 0.1 mm.

7. The semiconductor laser according to claim 1,
wherein the cover plate and/or the side wall is made of a glass,
wherein a refractive index of the cover plate and/or the side wall for the laser radiation generated in operation at a temperature of 300 K is between 1.4 and 1.6, inclusive.

8. The semiconductor laser according to claim 1,
wherein the exit regions have different shapes in plan view of the light exit surface and/or in cross-section through the light exit surface.

9. The semiconductor laser according to claim 1,
wherein at least one of the exit regions is oriented obliquely with respect to the light exit plane, wherein an angle between the light exit plane and the respective exit region is between 0.5° and 5°, inclusive.

10. The semiconductor laser according to claim 1,
wherein a light entrance surface of the cover plate and/or the side wall is planar,
wherein the light entrance surface faces the light exit surface, and a distance of the laser diode chips from the light entrance surface along a beam path is between 0.3 mm and 3 mm, inclusive.

11. The semiconductor laser according to claim 1,
wherein one of the laser diode chips is configured to generate red light, one of the laser diode chips is configured to generate green light, and one of the laser diode chips is configured to generate blue light, and the laser diode chips are electrically controllable independently of each other,
wherein the laser diode chips are jointly followed by a beam shaping optics and/or a movable deflection mirror.

12. The semiconductor laser according to claim 1,
wherein the exit regions are directly provided with at least one anti-reflective coating, wherein the exit regions are arranged along a straight line as seen in plan view of the light exit plane, and wherein an average roughness of the exit regions is at most 0.2 μm in each case.

13. The semiconductor laser according to claim 1,
    wherein the exit regions are all located in the side wall.

14. A method of manufacturing a semiconductor laser according to claim 1 comprising the steps:
    A) providing the housing, preferably with the laser diode chips fully encapsulated therein,
    B) operating the laser diode chips and measuring a radiation characteristic from each of the laser diode chips,
    C) modifying the cover plate and/or the side wall in the exit regions so that positioning tolerances of the laser diode chips in the housing are compensated and the optical path length for the laser radiation of all laser diode chips up to the light exit plane is equal with a tolerance of at most 3 μm and/or is equal with a tolerance of at most 3 μm to a previously predetermined target value.

15. The method of manufacturing according to claim 14,
    wherein in step C) material is removed from the cover plate and/or from the side wall so that the cover plate and/or the side wall becomes thinner in at least one of the exit regions than adjacent to the exit regions.

16. The method of manufacturing according to claim 15,
    wherein the material removal is performed by means of laser ablation and/or by means of laser-induced structural change within the cover plate and/or within the side wall and subsequent etching.

17. The method of manufacturing according to claim 14,
    in which, after step C), at least one of the exit regions is smoothed by means of laser polishing.